United States Patent [19]

Yanagisawa et al.

[11] Patent Number: 4,853,549
[45] Date of Patent: Aug. 1, 1989

[54] ELECTRON BEAM DRAWING METHOD

[75] Inventors: Akira Yanagisawa, Ome; Kazumitsu Nakamura, Katsuta, both of Japan

[73] Assignee: Hitachi, Ltd., Tokyo, Japan

[21] Appl. No.: 178,970

[22] Filed: Apr. 7, 1988

[30] Foreign Application Priority Data

Apr. 8, 1987 [JP] Japan ................... 62-84755

[51] Int. Cl.⁴ .......................................... H01J 37/304
[52] U.S. Cl. .............................. 250/491.1; 250/492.2; 356/401
[58] Field of Search ............ 250/491.1, 492.22, 492.2, 250/398; 356/401

[56] References Cited

FOREIGN PATENT DOCUMENTS 57-204127 12/1982 Japan .

OTHER PUBLICATIONS

Davis et al., IBM Journal of Research and Development, Nov. 1977, pp. 498–505.

Primary Examiner—Jack I. Berman
Attorney, Agent, or Firm—Antonelli, Terry & Wands

[57] ABSTRACT

The invention relates to an electron beam drawing method by a matching mark detecting method for use in manufacturing of semiconductor devices. First, the surface of a semiconductor wafer is divided into a number of blocks. Each block is divided into a number of chips. Four matching marks are formed at four corners of the block. Next, the matching marks are detected by an electron beam. When the electron beam deflecting system is corrected on the basis of the position information of the detected matching marks, different correcting equations are used in correspondence to the number of matching marks detected.

2 Claims, 2 Drawing Sheets

ELECTRON BEAM DRAWING METHOD

BACKGROUND OF THE INVENTION

The present invention relates to an electron beam drawing method and, more particularly, to a matching correcting method suitable to directly draw an electron beam by a matching mark detecting method.

In the case of manufacturing semiconductor devices by directly drawing an electron beam, it is important to match patterns of respective layers.

An arrangement of a number of semiconductor device chips on a semiconductor wafer is previously accurately determined at the design stage. Therefore, in theory, it is sufficient to draw so as to overlap the coordinates of the relevant chip every layer. However, in the actual conditions, there exist deformation of the water and the like in association with the rotating, shifting, and processing steps to set the wafer into an electron beam drawing apparatus. As disclosed in JP-A-57-204127, upon drawing, it is necessary to input those information and to correct a deflecting system of an electron beam and then to draw.

Namely, to measure rotation amount, shift amount, and deformation amount of the wafer, the arrangement of the semiconductor device chips is divided into matching blocks, and the matching marks formed at four corners of each matching block are detected by the electron beam. The rotation, shift, and deformation amounts are calculated from the coordinates of the detected matching marks. The deflection correcting system of the electron beam is corrected, then the electron beam is drawn.

The correcting equations at this time are expressed by the equations (1).

$$\begin{aligned} \Delta X &= AX + BY + CXY + D \\ \Delta Y &= A'X + B'Y + CXY + D' \end{aligned} \quad (1)$$

In the equations (1), X and Y denote coordinates from the center of a block, and $\Delta X$ and $\Delta Y$ indicate correction amounts, A, B, C, D, A', B', C', and D' are called correction coefficients and have the following meanings, respectively.

A : gain term in the X direction,
B : rotational term regarding a Y axis,
C : trapezoid term which is symmetrical with respect to the Y axis,
D : shift term in the X direction,
A': rotational term regarding an X axis,
B': gain term in the Y direction,
C': trapezoid term which is symmetrical with respect to the X axis,
D': shift term in the Y direction.

The correction coefficients A to D' are calculated by the following procedure. Four matching marks are set in the first to fourth quadrants of a block, respectively. The coordinates of the four matching marks are represented by $(X_1, Y_1)$, $(X_2, Y_2)$, $(X_3, Y_3)$, and $(X_4, Y_4)$, respectively. On the other hand, the detection coordinates of the matching mark positions in the block which is actually detected are represented by $(x_1, y_1)$, $(x_2, y_2)$, $(x_3, y_3)$, and $(x_4, y_4)$, respectively.

By applying the correcting equations (the equations 1) to the design mark coordinates $(X_i, Y_i)$ and the actually detected mark coordinates $(x_i, y_i)$, the following equations are obtained.

$$\begin{aligned} (x_1 - X_1) &= AX_1 + BY_1 + CX_1Y_1 + D \\ (y_1 - Y_1) &= A'X_1 + B'Y_1 + C'X_1Y_1 + D' \end{aligned} \quad (2\text{-}1)$$

$$\begin{aligned} (x_2 - X_2) &= AX_2 + BY_2 + CX_2Y_2 + D \\ (y_2 - Y_2) &= A'X_2 + B'Y_2 + C'X_2Y_2 + D' \end{aligned} \quad (2\text{-}2)$$

$$\begin{aligned} (x_3 - X_3) &= AX_3 + BY_3 + CX_3Y_3 + D \\ (y_3 - Y_3) &= A'X_3 + B'Y_3 + C'X_3Y_3 + D' \end{aligned} \quad (2\text{-}3)$$

$$\begin{aligned} (x_4 - X_4) &= AX_4 + BY_4 + CX_4Y_4 + D \\ (y_4 - Y_4) &= A'X_4 + B'Y_4 + C'X_4Y_4 + D' \end{aligned} \quad (2\text{-}4)$$

From these eight equations, eight unknowns A to D' are calculated by a method of least squares. The foregoing procedure is executed every matching block, thereby realizing the high accurate pattern matching among the layers.

In general, as mentioned above, the matching marks at four corners in the matching block are detected to obtain the correction coefficients and the matching drawing is executed. However, when this method is actually applied, there is a case where some of the matching marks at four corners are not detected because of the reasons such as breakage of matching marks and the like. As will be understood from the equations (2), if a detection error occurs even in one of the four matching marks, the correction coefficients A to D' as eight unknowns cannot be calculated. Hitherto, when such a mark error occurs, the relevant block is not drawn and the process advances to the shift block, or it is drawn by using the correction coefficients of the preceding block.

SUMMARY OF THE INVENTION

In the foregoing conventional technique, when a detection error of a matching mark occurs, there is taken only means for deciding whether the drawing of the relevant block is simply skipped or the correction coefficients of the preceding block are used. In the former case, there is a problem such that the yield of the semiconductor device chips which can be derived as complete products from the whole wafer decreases. In the latter case, there is a problem such that the fine matching accuracy cannot be realized.

It is an object of the present invention to provide a method of realizing the high accurate matching even if a detection error of matching marks occurs.

Semiconductor devices are generally formed by ten and a few processing steps. Every step, the wafer is held in the cassette and set in the drawing apparatus and accurately overlaid on the pattern which has been formed in the preceding step, then the drawing is performed. At this time, the pattern is rotated and shifted from the fundamental coordinates system of the apparatus due to a variation in machining accuracy of cassettes, a variation in setting position of the wafer, or the like. It is necessary to measure the rotation amount and shift amount and to correct the drawing coordinates system and thereby to draw. At this time, the correcting equations are as follows.

$$\Delta X = BY + D \\ \Delta Y = A'X + D' \quad \} \quad (3)$$

In the case of the simple rotation of the wafer, $A' = -B$ from the theory of the coordinates conversion and $A'$ has the same value at any position on the whole surface of the wafer (when the deformation and distortion of the wafer are not considered). Since the shift amounts $D$ and $D'$ change every chip (every block), it is necessary to calculate this value every chip.

The rotation amount differs every setting position of the wafer and every cassette due to the machining accuracy of the cassette or the like. The maximum rotation amount is about 1 μm for 1 mm. So long as the correction is not performed, the matching accuracy of 0.1 μm or less cannot be expected. To obtain the shift amount, the center coordinates of each chip (block) are calculated from the detection coordinates of the wafer marks formed on the right and left sides of the wafer by considering the rotation of the wafer. Therefore, the maximum shift amount is about 0.1 μm. If the shift amount is not accurately measured with respect to each chip (block) and the correction is not performed, the matching accuracy of 0.1 μm or less cannot be expected.

On the other hand, it is also necessary to perform the correction for the deformation of the chip (block) due to the deformation of the wafer because of the execution of the processes in addition to the rotation and shift. Such a deformation appears as extension and contraction (corresponding to the gain term mentioned above) of the chip in the X and Y directions, rhombic deformation, and trapezoid deformation. However, in general, these amounts are small and the rhombic deformation and trapezoid deformation are 0.02 μm or less for 1 mm and the extension or contraction is 0.1 μm or less for 1 mm. The extension and contraction are generally isotropic in the X and Y directions. The amount of correction term due to the deformation of the wafer is small and cannot be omitted when the high accurate overlap is required. However, it can be ignored in the case where it is sufficient to perform the rough correction.

Therefore, according to the invention, in the case of the misdetection of one mark, the trapezoid deformation in which the influence on the matching accuracy is the smallest is ignored. The correction is executed for the extension/contraction whose amounts differ in the X and Y directions, simple rotation and rhombic deformation of the wafer, and shift term.

In the case of the misdetection of two marks, the trapezoid deformation and rhombic deformation are ignored and it is assumed that the wafer simply rotates and the extension and contraction are isotropically performed in the X and Y directions, then the correction is executed for the shift term.

In the case of the misdetection of three marks, it is assumed that the deformation is almost the same as the deformation of the preceding chip, and only the shift term is obtained and the correction is executed by using the correction coefficients of the preceding chip (block).

BRIEF DESCRIPTION OF THE DRAWINGS

The drawings are explanatory diagrams for correction drawing in the case where mark detection errors occur according to an embodiment of the present invention, in which.

DESCRIPTION OF THE PREFERRED EMBODIMENTS

An embodiment of the present invention will be described hereinbelow.

Figure 1:
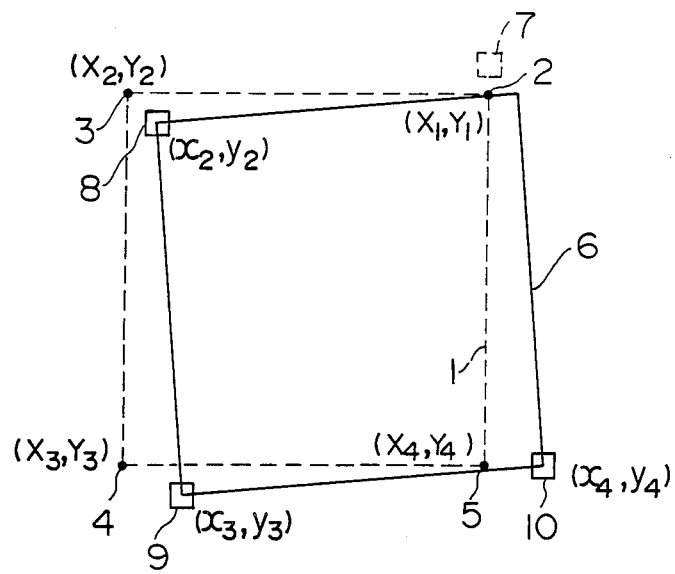
FIG. 1 shows the case where one mark cannot be detected.

(1) When a detection error of one matching mark occurs:

FIG. 1 shows an embodiment in the case where among four matching marks 7 to 10, the mark 7 in the first quadrant cannot be detected due to a mark detection error. In the diagram, reference numeral 1 denotes a design external shape of a matching block; 2 to 5 represent design matching mark positions; 6 a detected external shape of the matching block; and 7 to 10 the detected matching mark positions. The same portions in FIGS. 2 and 3 as those in FIG. 1 are designated by the same reference numerals.

As in this embodiment, the correcting equations when one of the four matching marks cannot be detected are as follows, while eliminating the trapezoid terms from the correcting equations (1).

$$\Delta X = AX + BY + D \\ \Delta Y = A'X + B'Y + D' \quad \} \quad (4)$$

Six constants are unknowns and can be calculated by the method of least squares from six equations (5) for connecting the detected three matching mark coordinates values $(x_i, y_i)$, $(i=2, 3, 4)$ with the design values $(X_i, Y_i)$ $(i=2, 3, 4)$ of the matching mark coordinates.

$$(x_i - X_i) = AX_i + BY_i + D \\ (y_i - Y_i) = A'X_i + B'Y_i + D' \quad \} \quad (5)$$

$$(i = 2, 3, 4)$$

In this embodiment, the case where the mark 7 in the first quadrant is not detected has been described. However, in the case where the mark in the other quadrant is not detected, by forming the equations (5) regarding the coordinates of the detected mark, the correction coefficients of the relevant block can be also obtained.

Figure 2:
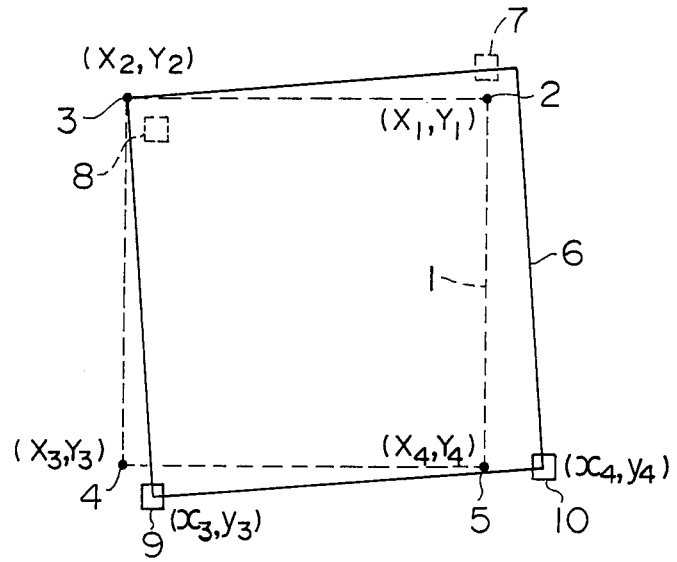
FIG. 2 shows the case where two marks cannot be detected.

(2) The case where detection errors of two matching marks occur:

FIG. 2 shows an embodiment in the case where among the four matching marks 7 to 10, the marks 7 and 8 in the first and second quadrants cannot be detected due to the mark detection errors.

As in this embodiment, the correcting equations when two of the four matching marks cannot be detected are as shown in the equations (6) by assuming that in the correcting equations (4), the gain terms in the X and Y directions are equal ($A=B'$) and that for the rotational terms, the pattern is simply rotated ($A'=-B$) with respect to the X and Y axes.

$$\Delta X = AX + BY + D \quad (6)$$
$$\Delta Y = -BX + AY + D'$$

The correction coefficients A, B, D, and D' as four unknowns can be calculated by a method of least squares by the following four equations (7) for connecting the two detected matching mark coordinates $(x_i, y_i)$ (i=3, 4) with the design values $(X_i, Y_i)$ (i =3, 4) of the matching mark coordinates.

$$(x_i - X_i) = AX_i + BY_i + D \quad (7)$$
$$(y_i - Y_i) = -BX_i + AY_i + D'$$

$$(i = 3, 4)$$

In this embodiment, the case where the matching marks 7 and 8 in the first and second quadrants cannot be detected has been described. However, even in the case where the marks in the other two quadrants cannot be detected, by forming the equations (6) regarding the coordinates of the two detected marks, the correction coefficients of the relevant block can be derived.

Figure 3:
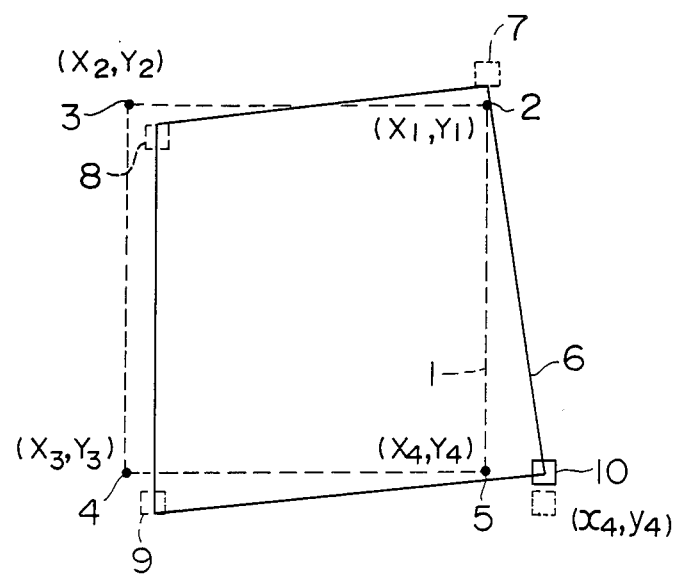
FIG. 3 shows the case where three marks cannot be detected.

(3) The case where detection errors of three matching marks occur:

FIG. 3 shows an embodiment in the case where among the four matching marks 7 to 10, the marks 7, 8, and 9 in the first to third quadrants cannot be detected due to the mark detection errors.

As in this embodiment, when three of the four matching marks cannot be detected, the following correcting equations (8) are used.

$$\Delta X = *AX + *BY + *CXY + D \quad (8)$$
$$\Delta Y = *A'X + *B'Y + *CXY + D'$$

where, *A, *B, *C, *A', *B', and *C' denote correction coefficients of the preceding block. The shift terms D and D' in the X and Y directions are two unknowns and can be obtained by the following equations (9) from the detected mark coordinates $(x_i, y_i)$ (i=4) and the design values $(X_i, Y_i)$ (i =4) of the mark coordinates.

$$(x_i - X_i) = D \quad (9)$$
$$(y_i - Y_i) = D'$$

$$(i = 4)$$

Although this embodiment has been described with respect to the case where only the mark in the fourth quadrant is detected, the invention can be also similarly applied to the case where the mark in the other quadrant is detected.

(4) The case where detection errors of all of the marks occur:

When detection errors of all of the marks occur, no correction coefficient can be obtained. Therefore, there is used the conventional method whereby it is determined whether the processes advance without drawing the relevant block or the block is drawn by using the correction coefficients of the preceding block.

According to the invention, if at least one block mark is detected, the correction can be correctly performed. Therefore, there are advantages such that the matching accuracy of the whole wafer can be improved and the yield of the complete chips can be improved.

We claim:

1. An electron beam drawing method whereby a surface of a semiconductor wafer is divided into a number of blocks, each block is divided into a plurality of chips, four matching marks are formed in each of the blocks, a correction is made to an electron beam deflecting system on the basis of position information of detected matching marks, and the blocks are then drawn,
    wherein the correction is performed on the basis of different correcting equations in correspondence to the number of said matching marks detected, and
    wherein when the number of said matching marks detected is three, six correction coefficients are determined by a method of least squares on the basis of the coordinates of said three matching marks detected and thereafter, the correction is executed by using the following correcting equations:

$$\Delta X = AX + BY + D$$

$$\Delta = A'X + B'Y + D'$$

where, X and Y denote coordinates from the center of the block, $\Delta X$ and $\Delta Y$ indicate correction amounts, and A, B, D, A', B' and D' represent correction coefficients and have the following meanings:
A : gain term in the X direction,
B : rotational term regarding a Y axis,
D : shift term in the X direction,
A': rotational term regarding an X axis,
B': gain term in the Y direction,
D': shift term in the Y direction.

2. An electron beam drawing method whereby a surface of a semiconductor wafer is divided into a number of blocks, each block is divided into a plurality of chips, four matching marks are formed in each of the blocks, a correction is made to an electron beam deflecting system on the basis of position information of detected matching marks, and the blocks are then drawn,
    wherein the correction is performed on the basis of different correcting equations in correspondence to the number of said matching marks detected, and
    wherein when the number of said matching marks detected is two, four correction coefficients are determined by a method of least squares on the basis of the coordinates of said two detecting matching marks and thereafter, the correction is performed by using the following correcting equations:

$$\Delta X = AX + BY + D$$

$$\Delta Y = BX + AY + D'$$

where, X and Y denote coordinates from the center of the block, $\Delta X$ and $\Delta Y$ indicate correction amounts, and A, B, and D represent correction coefficients and have the following meanings:
A : gain term in the X direction,
B : rotational term regarding a Y axis,
D : shift term in the X direction,
D':shift term in the Y direction.

* * * * *